United States Patent
Liu

(10) Patent No.: US 10,163,730 B2
(45) Date of Patent: Dec. 25, 2018

(54) SEMICONDUCTOR DEVICE STRUCTURE WITH GATE SPACER HAVING PROTRUDING BOTTOM PORTION AND METHOD FOR FORMING THE SAME

(71) Applicant: Taiwan Semiconductor Manufacturing Co., Ltd., Hsinchu (TW)

(72) Inventor: Yung-Tsun Liu, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/982,070

(22) Filed: May 17, 2018

(65) Prior Publication Data

US 2018/0269114 A1  Sep. 20, 2018

Related U.S. Application Data

(60) Continuation of application No. 15/355,483, filed on Nov. 18, 2016, now Pat. No. 9,997,417, which is a
(Continued)

(51) Int. Cl.
*H01L 21/28* (2006.01)
*H01L 21/306* (2006.01)
(Continued)

(52) U.S. Cl.
CPC ..... *H01L 21/823864* (2013.01); *H01L 21/31111* (2013.01); *H01L 21/31116* (2013.01); *H01L 21/441* (2013.01); *H01L 21/465* (2013.01);

*H01L 21/8258* (2013.01); *H01L 21/823814* (2013.01); *H01L 27/092* (2013.01);
(Continued)

(58) Field of Classification Search
CPC ......... H01L 21/00; H01L 21/20; H01L 21/28; H01L 21/306; H01L 21/283; H01L 21/30604; H01L 21/82; H01L 21/311; H01L 21/8238; H01L 21/3115; H01L 21/31155; H01L 21/441; H01L 21/465;
(Continued)

(56) References Cited

U.S. PATENT DOCUMENTS 6,376,318 B1  4/2002  Lee et al.
7,968,912 B2  6/2011  Kim et al.
(Continued)

FOREIGN PATENT DOCUMENTS

DE    101 46 933 A1    4/2003
JP    2001-057428      2/2001
KR    10-2004-0054145  6/2004

*Primary Examiner* — Chuong A Luu
(74) *Attorney, Agent, or Firm* — Haynes and Boone LLP

(57) ABSTRACT

A semiconductor device structure and method for forming the same are provided. The semiconductor device structure includes a substrate and a gate stack structure formed on the substrate. The semiconductor device structure also includes gate spacers formed on the sidewall of the gate stack structure, and the gate spacers include a top portion and a bottom portion adjoined to the top portion, and the bottom portion slopes to a top surface of the substrate. The semiconductor device structure further includes an epitaxial structure formed adjacent to the gate spacers, and the epitaxial structure is formed below the gate spacers.

20 Claims, 6 Drawing Sheets

Related U.S. Application Data division of application No. 14/490,888, filed on Sep. 19, 2014, now Pat. No. 9,502,412.

(51) Int. Cl.

| | | |
|---|---|---|
| *H01L 21/8238* | (2006.01) | |
| *H01L 21/441* | (2006.01) | |
| *H01L 21/465* | (2006.01) | |
| *H01L 21/8258* | (2006.01) | |
| *H01L 27/092* | (2006.01) | |
| *H01L 29/08* | (2006.01) | |
| *H01L 29/161* | (2006.01) | |
| *H01L 29/26* | (2006.01) | |
| *H01L 29/423* | (2006.01) | |
| *H01L 29/66* | (2006.01) | |
| *H01L 29/78* | (2006.01) | |
| *H01L 29/165* | (2006.01) | |
| *H01L 21/311* | (2006.01) | |
| *H01L 29/06* | (2006.01) | |

(52) U.S. Cl.
CPC ...... *H01L 29/0649* (2013.01); *H01L 29/0847* (2013.01); *H01L 29/161* (2013.01); *H01L 29/165* (2013.01); *H01L 29/26* (2013.01); *H01L 29/4232* (2013.01); *H01L 29/6656* (2013.01); *H01L 29/66636* (2013.01); *H01L 29/78* (2013.01); *H01L 29/7848* (2013.01)

(58) Field of Classification Search
CPC ........... H01L 21/8258; H01L 21/31111; H01L 21/31116; H01L 21/823814
USPC ........................................................ 438/299
See application file for complete search history.

(56) References Cited

U.S. PATENT DOCUMENTS

| | | |
|---|---|---|
| 8,202,767 B2 | 6/2012 | Cheng et al. |
| 8,455,952 B2 | 6/2013 | Lin et al. |
| 8,482,079 B2 | 7/2013 | Cheng et al. |
| 8,674,453 B2 | 3/2014 | Tsai et al. |
| 8,796,788 B2 | 8/2014 | Kwok et al. |
| 8,900,958 B2 | 12/2014 | Tsai et al. |
| 8,940,594 B2 | 1/2015 | Chen et al. |
| 2014/0021517 A1 | 1/2014 | Cheng et al. |
| 2014/0103407 A1* | 4/2014 | Chang ............... H01L 21/28247 257/288 |
| 2015/0200252 A1* | 7/2015 | Ching ................. H01L 29/0649 257/510 |
| 2015/0255543 A1* | 9/2015 | Cheng ................. H01L 29/7848 257/288 |

\* cited by examiner

SEMICONDUCTOR DEVICE STRUCTURE WITH GATE SPACER HAVING PROTRUDING BOTTOM PORTION AND METHOD FOR FORMING THE SAME

CROSS-REFERENCE TO RELATED APPLICATION

The present application is a continuation application of U.S. patent application Ser. No. 15/355,483, filed Nov. 18, 2016 now U.S. Pat. No. 9,997,417, which is a divisional application of U.S. patent application Ser. No. 14/490,888, filed Sep. 19, 2014, now U.S. Pat. No. 9,502,412, entitled "SEMICONDUCTOR DEVICE STRUCTURE WITH GATE SPACER HAVING PROTRUDING BOTTOM PORTION AND METHOD FOR FORMING THE SAME", each of which are hereby incorporated by reference in its entirety.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, or in other types of packaging, for example.

A MOSFET with stressor regions is often formed by using epitaxially grown semiconductor materials to form source and drain features. Various techniques directed at the shapes, configurations, and materials of the source and drain features have been implemented to further improve transistor device performance.

Although existing approaches have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
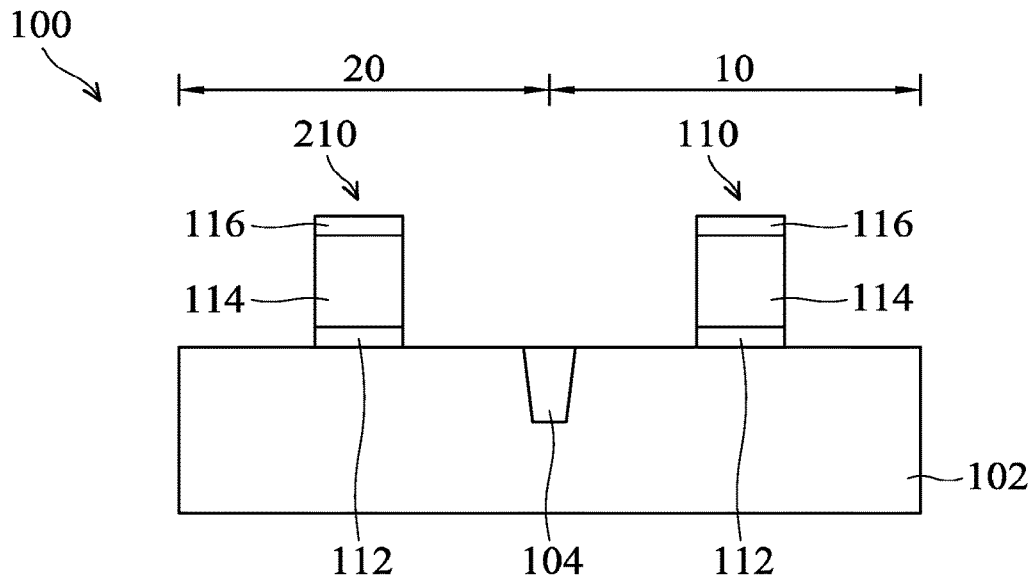
FIGS. 1A-1J show cross-sectional representations of various stages of forming a semiconductor device structure, in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It is understood that additional operations can be provided before, during, and after the method, and some of the operations described can be replaced or eliminated for other embodiments of the method.

Embodiments for forming a semiconductor device structure are provided. FIGS. 1A-1J show cross-sectional representations of various stages of forming a semiconductor device structure 100, in accordance with some embodiments of the disclosure.

The semiconductor device structure 100 includes a substrate 102. The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

The substrate 102 may further include isolation features 104, such as shallow trench isolation (STI) features or local oxidation of silicon (LOCOS) features. The isolation features 104 may define and isolate various integrated circuit devices. Integrated circuit devices, such as metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), diodes, or other suitable elements, are formed in and/or on the substrate 102.

The semiconductor device structure 100 includes a first conductive type device region 10 and a second conductive type device region 20. In some embodiments, the first conductive type device region 10 is a PMOS device region, and the second conductive type device region 20 is a NMOS device region. A first gate stack structure 110 is formed in the first conductive type device region 10, and a second gate stack structure 210 is formed in the second conductive type device region 20.

The first gate stack structure 110 includes a gate dielectric layer 112, a gate electrode layer 114 and a hard mask layer 116. The second gate stack structure 210 also includes the gate dielectric layer 112, the gate electrode layer 114 and the hard mask layer 116. The gate dielectric layer 112 is formed on the substrate 102, and the gate electrode layer 114 is formed on the gate dielectric layer 112. The hard mask layer 116 is formed on the gate electrode layer 114.

The gate dielectric layer 112 may be made of silicon oxide, silicon oxynitride, or a high dielectric constant material (high-k material). The high dielectric constant material may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), or another suitable high-k dielectric material. The high-k material may further include metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina ($HfO_2$—$Al_2O_3$) alloy, or another applicable material. The gate dielectric layer 112 may be formed by any suitable process, such as atomic layer deposition (ALD), chemical vapor deposition (CVD), physical vapor deposition (PVD), remote plasma CVD (RPCVD), plasma enhanced CVD (PECVD), metal organic CVD (MOCVD), sputtering, plating, or another suitable process.

The gate electrode layer 114, such as polysilicon, metal or metal silicide, is formed on the gate dielectric layer 112. In some embodiments, the gate electrode layer 114 is made of a polysilicon layer which serves as a dummy gate that is replaced in a subsequent gate replacement process. In some embodiments, the gate electrode layer 114 is formed by using a CVD process.

Alternatively, the gate electrode layer 114 may include a conductive layer having a proper work function, and therefore, the gate electrode layer 114 can also be referred to as a work function layer. The work function layer includes any applicable material, such that the layer can be tuned to have a proper work function for enhanced performance of the associated device. For example, if a p-type work function metal (p-metal) for the PMOS device is desired, titanium nitride (TiN) or tantalum nitride (TaN) may be used. On the other hand, if an n-type work function metal (n-metal) for the NMOS device is desired, tantalum (Ta), titanium aluminum alloy (TiAl), titanium aluminum nitride (TiAlN), or tantalum carbide nitride (TaCN), may be used. The work function layer may include doped conducting oxide materials. The gate electrode layer 114 may include other conductive materials, such as aluminum, copper, tungsten, metal alloys, metal silicide, another suitable material, or combinations thereof. For example, when the gate electrode layer 114 includes a work function layer, another conductive layer can be formed over the work function layer.

The hard mask layer 116 may include silicon oxide, silicon nitride (SiN), silicon oxynitride (SiON), silicon carbide (SiC), SiOC, spin-on glass (SOG), a low-k film, tetraethylorthosilicate (TEOS), plasma enhanced CVD oxide (PE-oxide), high-aspect-ratio-process (HARP) formed oxide, amorphous carbon material, tetraethylorthosilicate (TEOS), another applicable material, and/or combinations thereof.

The first gate stack structure 110 and the second gate stack structure 210 are formed by a deposition process, a photolithography process and an etching process. The deposition process include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, another suitable method, and/or combinations thereof. The photolithography processes include photoresist coating (e.g., spin-on coating), soft baking, mask aligning, exposure, post-exposure baking, developing the photoresist, rinsing, drying (e.g., hard baking). The etching process includes a dry etching process or a wet etching process. Alternatively, the photolithography process is implemented or replaced by other proper methods such as maskless photolithography, electron-beam writing, or ion-beam writing.

Figure 1B:
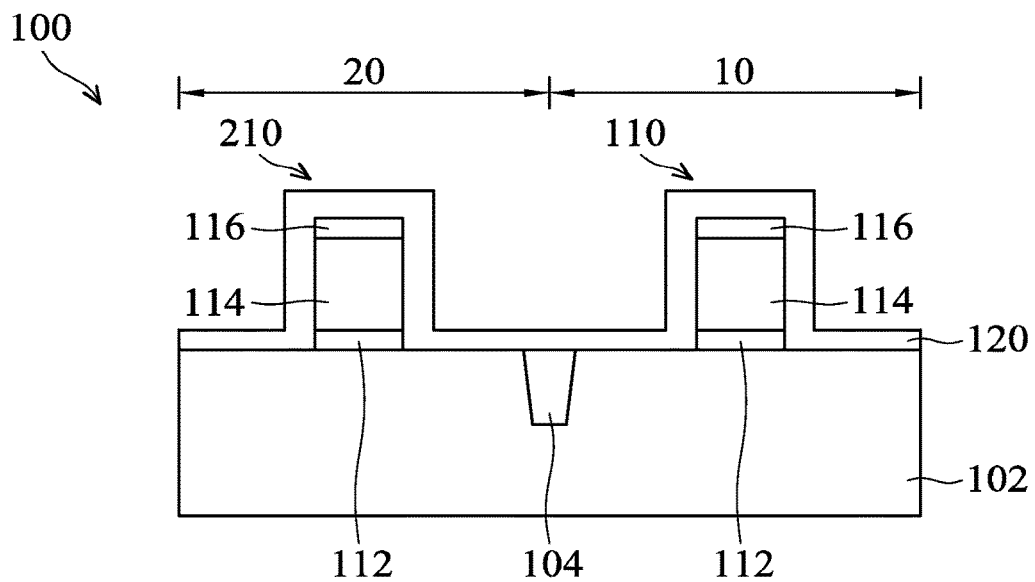

After the first gate stack structure 110 and the second gate stack structure 210 are formed, a dielectric layer 120 is conformally formed on the first gate stack structure 110 and the second gate stack structure 210 as shown in FIG. 1B, in accordance with some embodiments of the disclosure.

Figure 1C:
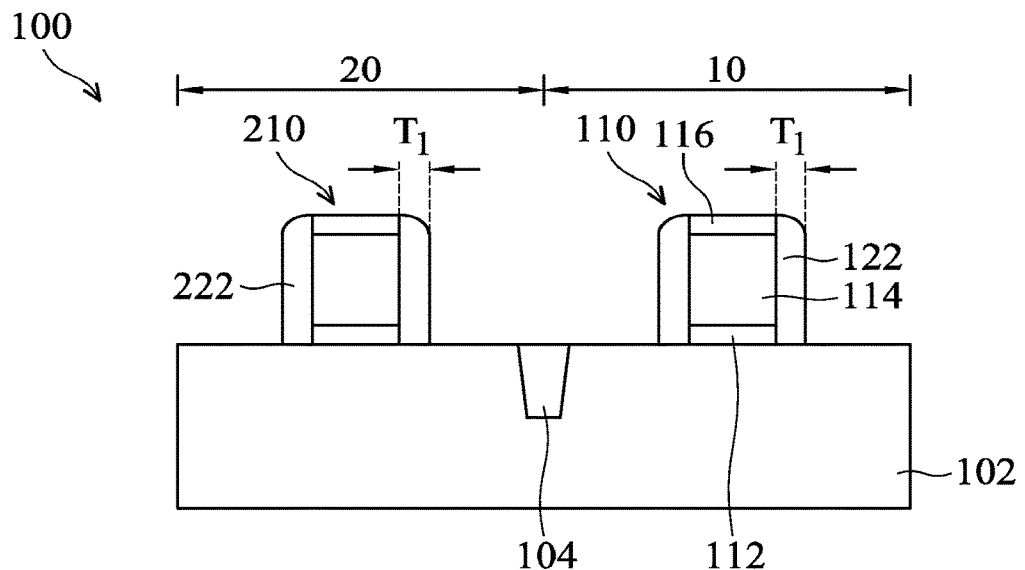

After the dielectric layer 120 is formed, a first etching process is performed to remove a portion of the dielectric layer 120 to form the first gate spacers 122 and the second gate spacers 222 as shown in FIG. 1C, in accordance with some embodiments of the disclosure. The first gate spacers 122 are formed on opposite sidewalls of the first gate stack structure 110. The second gate spacers 222 are formed on the opposite sidewalls of the second gate stack structure 210.

The first gate spacers 122 are made of silicon oxide, silicon nitride, silicon oxynitride, or another applicable dielectric material, or combinations thereof. The first gate spacers 122 may include one layer or multiple layers. In some embodiments, the first gate spacers 122 have a thickness $T_1$ in a range from about 140 A to about 300 A.

In some embodiments, the first etching process is a dry etching process. In some embodiments, the dry etching process is operated by power in a range from about ?? 70 W to about 130 W. In some embodiments, the dry etching process is operated at a temperature in range from about 90° C. to about 150° C.

Afterwards, a first protective layer 232 and a second protective layer 234 are formed on the second gate stack structure 210, a first photoresist layer 205 is formed on the second protective layer 234.

Figure 1D:
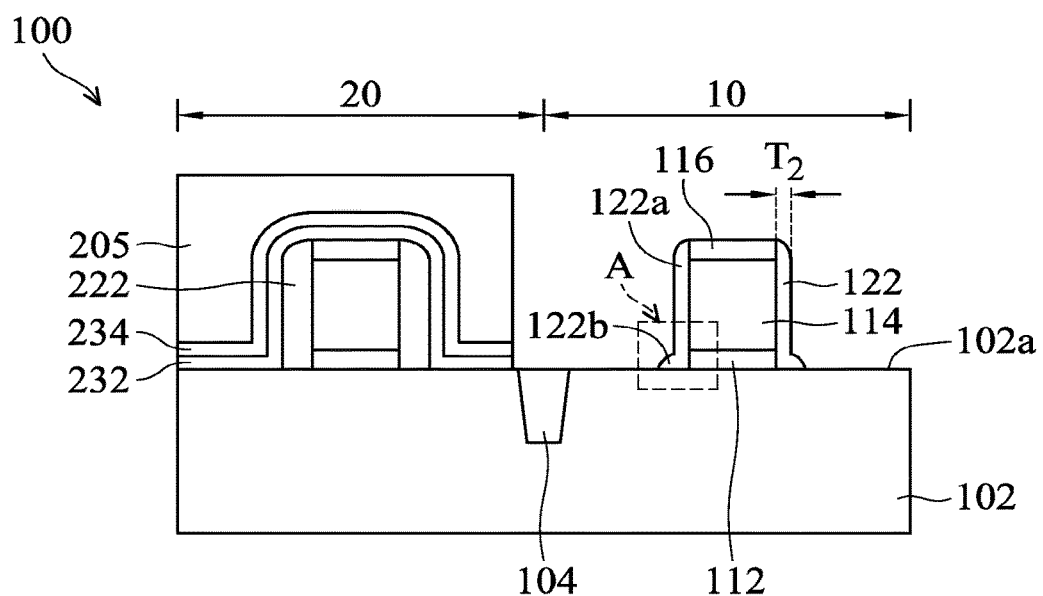

After the first photoresist layer 205 is formed, the first gate spacers 122 are further etched by a second etching process to form the first gate spacers 122 having a protruding bottom portion 122*b* as shown in FIG. 1D, in accordance with some embodiments of the disclosure.

The first protective layer 232 and the second protective layer 234 are used to protect the underlying layers from being damaged during subsequent processes.

The first protective layer 232 and the second protective layer 234 are made of different materials. In some embodiments, the first protective layer 232 is made of silicon oxide ($SiO_2$), the second protective layer 234 is made of silicon nitride ($Si_3N_4$). The first protective layer 232 and the second protective layer 234 are respectively formed by low-pressure chemical vapor deposition (LPCVD), plasma-enhanced chemical vapor deposition (PECVD), atomic layer deposition (ALD), or another applicable process, or combinations thereof.

The photoresist layer 205 is used to protect the second gate stack structure 210 from being damaged by the subsequent process, such as an etching process. The photoresist layer 205 is deposited by a deposition process, such as a spin-on process.

The second etching process is a wet etching process. In some embodiments, a hydrofluoric acid (HF) solution is used as etching reagent. In some embodiments, the HF solution has a concentration in a range from about 3000 ppm to about 6000 ppm. In some embodiments, the HF etching process is operation in a period in a range from about 20 seconds to about 50 seconds.

Figure 2:
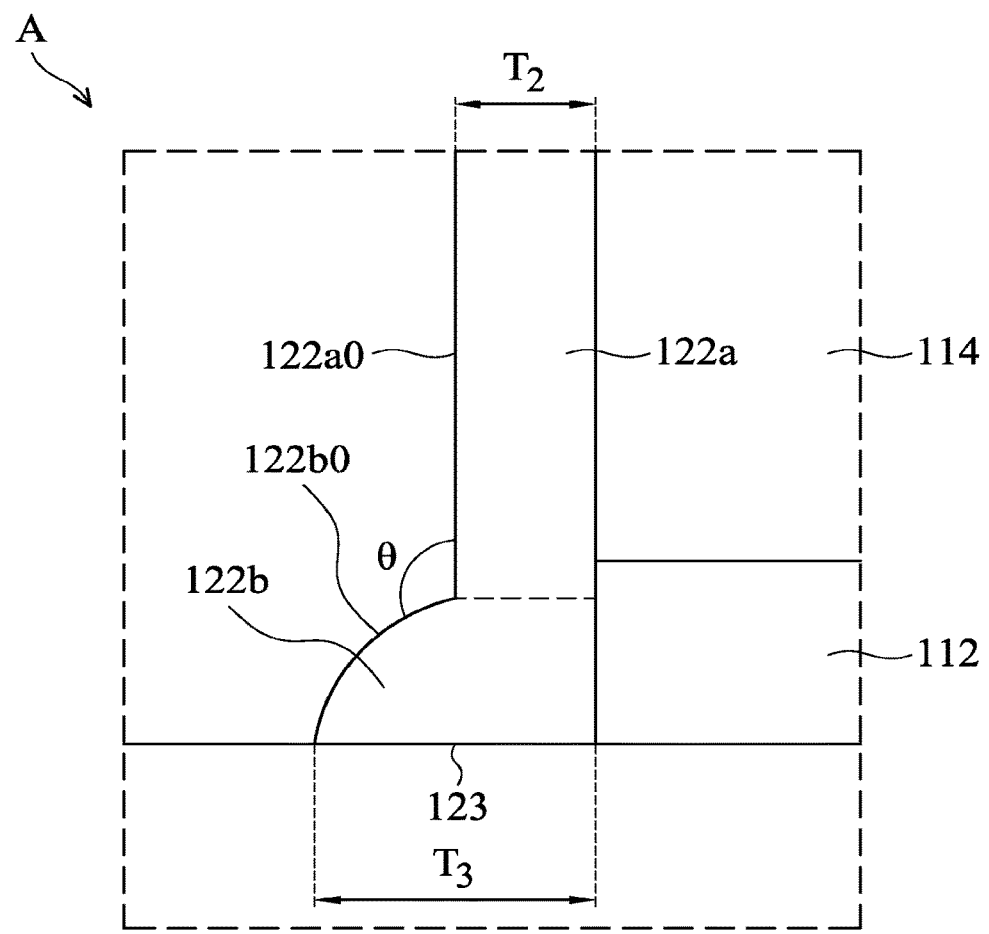
FIG. 2 shows an enlarged representation of region A of FIG. 1D, in accordance with some embodiments of the disclosure.

FIG. 2 is an enlarged representation of region A of FIG. 1D, in accordance with some embodiments of the disclosure.

The first gate spacers 122 have a top portion 122*a* and a bottom portion 122b adjoined to the top portion 122*a*. The top portion 122a has a uniform thickness $T_2$. In some embodiments, the thickness $T_2$ is in a range from about 60 A to about 100 A.

The bottom portion 122b slopes to a top surface of the substrate 102 and is in direct contact with the first epitaxial structure 126. In other words, the bottom portion 122b is gradually increased towards the substrate 102. The bottom portion 122b has a non-uniform thickness. In addition, the bottom portion 122b has a bottom surface 123 which is in direct contact with the substrate 102, and the bottom surface 123 has a maximum thickness $T_3$. In some embodiments, the thickness $T_3$ is in a range from about 5 nm to about 12 nm.

The top portion 122a of the gate spacers 122 has a first outer surface 122ao, the bottom portion 122b of the gate spacers 122 has a second outer surface 122b, an angle between the first outer surface 122ao and the second outer surface 122bo is in a range from about 90 degrees to about 178 degrees.

Figure 1E:
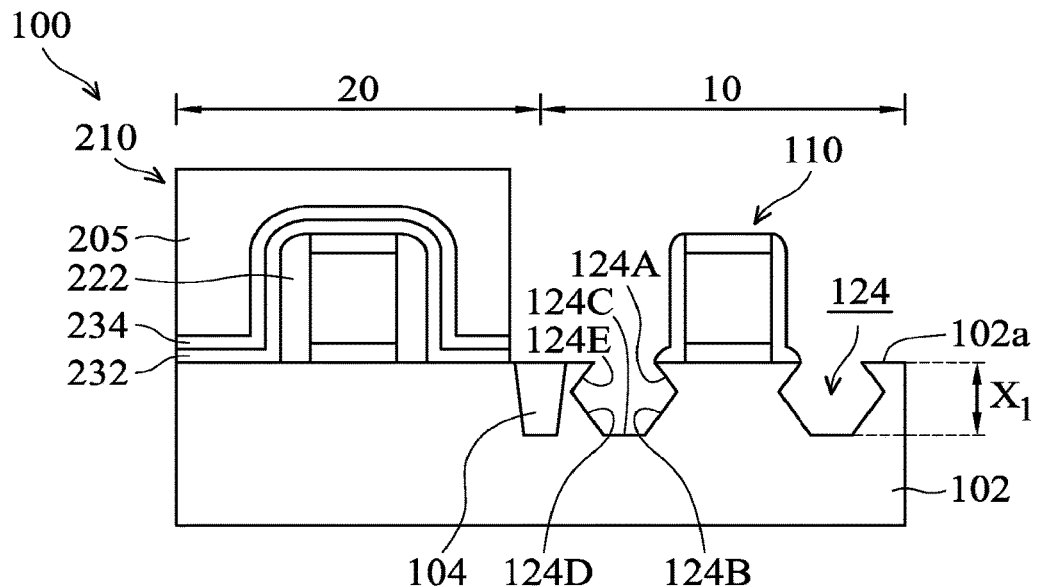

Afterwards, a portion of the substrate 102 is recessed to form recess 124 adjacent to the first gate stack structure 110 as shown in FIG. 1E, in accordance with some embodiments of the disclosure. The recess 124 is formed by a dry etching process, a wet etching process or combinations thereof.

The etching profile is defined by facets 124A, 124B, 124C, 124D, and 124E in the substrate 102. The facets 124A and 124E may be referred to as top sidewall facets, the facets 124B and 124D may be referred to as middle sidewall facets, and the facet 124C may be referred to as a bottom facet. The facet 124B is below facet 124A and the facet 124D is below the facet 124E. The facet 124C is parallel to the top surface 102a of the substrate 102.

In some embodiments, the etching profile of the recess 124 is defined by 124A, 124B, 124D, and 124E in a {111} crystallographic plane of the substrate 102, and facet 124C in a {100} crystallographic plane of the substrate 102.

The recess 124 has a depth $X_1$ from the top surface of the substrate 102 to the facet 124C. In some embodiments, the depth $X_1$ is in a range from about 34 nm to about 45 nm.

In some embodiments, the recess 124 is formed by a dry etching process that includes an etching gas, such as helium (He), argon (Ar), hydrogen bromide (HBr), nitrogen ($N_2$), methane ($CH_4$), tetrafluoromethane ($CF_4$), fluoro methane ($CH_3F$), difluoromethane ($CH_2F_2$), trifluoromethane($CHF_3$), another applicable etching gas, or combinations thereof.

In some embodiments, the recess 124 is formed by a wet etching process that includes an etching solution including ammonium hydroxide ($NH_4OH$), potassium hydroxide (KOH), hydrofluoric acid (HF), tetramethyl ammonium hydroxide (TMAH), another applicable etching solution, or combinations thereof.

Figure 1F:
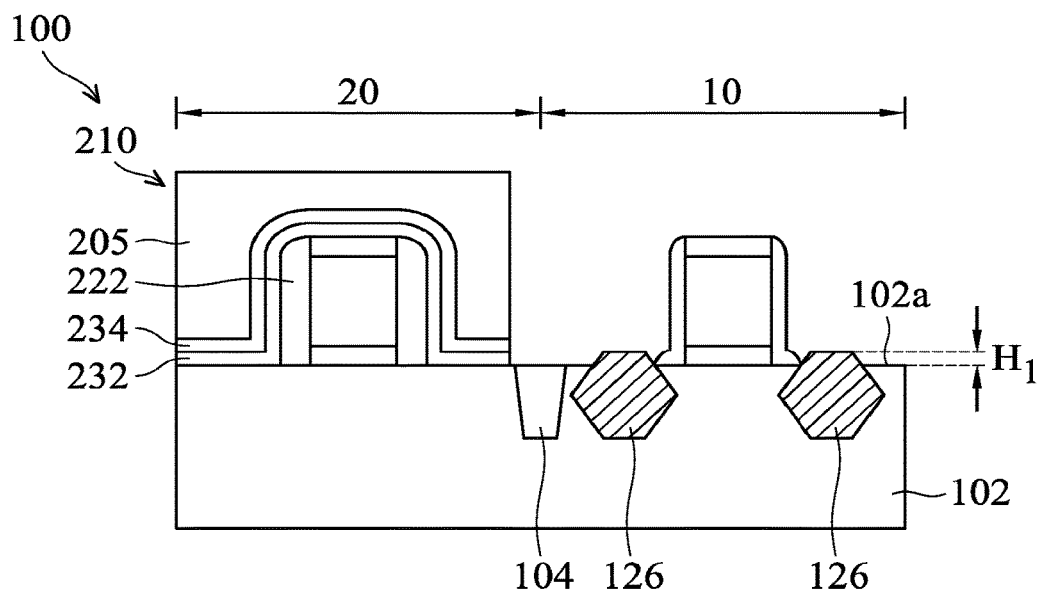

After the recesses 124 are formed, a first epitaxial structure 126 formed on the fin structure 104 as shown in FIG. 1F, in accordance with some embodiments of the disclosure.

The first first epitaxial structure 126 includes source/drain epitaxial structure. In some embodiments, when an N-type FET (NFET) device is desired, the source/drain epitaxial structures include an epitaxially grown silicon phosphor (SiP). Alternatively, when a P-type FET (PFET) device is desired, epitaxial source/drain structures include an epitaxially growing silicon germanium (SiGe). The first epitaxial structure 126 may have a single layer or a multiple layers.

The first epitaxial structure 126 may include a single-element semiconductor material such as germanium (Ge) or silicon (Si); or compound semiconductor materials, such as gallium arsenide (GaAs), aluminum gallium arsenide (AlGaAs); or semiconductor alloy, such as silicon germanium (SiGe), or gallium arsenide phosphide (GaAsP).

The first epitaxial structure 126 is formed by an epi process. The epi process may include a selective epitaxial growth (SEG) process, a chemical vapor deposition (CVD) process (e.g., vapor-phase epitaxy (VPE), a low pressure chemical vapor deposition (LPCVD) and/or ultra-high vacuum CVD (UHV-CVD)), molecular beam epitaxy, another applicable epi process, or combinations thereof. The formation process of the first epitaxial structure 126 may use gaseous and/or liquid precursors.

In some embodiments, the first epitaxial structure 126 is SiGe which is deposited by an epi process using a Si-containing gas (such as silane) and a Ge-containing gas (such as $GeH_4$ or $GeCl_4$),and a carrier gas (such as $H_2$). In some embodiments, the mass flow ratio of the Ge-containing gas to the Si-containing gas is equal to or less than 0.025.

The first epitaxial structure 126 may be doped or undoped in-situ during the epi process. For example, the epitaxially grown SiGe epitaxial structure may be doped with boron; and the epitaxially grown Si epitaxial structure may be doped with carbon to form a Si:C epitaxial structure, phosphorous to form a Si:P epitaxial structure, or both carbon and phosphorous to form a SiCP epitaxial structure. The doping may be achieved by an ion implantation process, plasma immersion ion implantation (PIII) process, gas and/or solid source diffusion process, another suitable process or combinations thereof. The first epitaxial structure 126 may further be exposed to annealing processes, such as a rapid thermal annealing process. The annealing process is used to activate the dopants. The annealing process includes rapid thermal annealing (RTA) and/or laser annealing process.

If the first epitaxial structure 126 is not doped in-situ, a second implantation process (i.e., a junction implant process) is performed to dope the first epitaxial structure 126.

As shown in FIG. 1F, the first epitaxial structure 126 has a raised height $H_1$ over the top surface 102a of the substrate 102. In some embodiments, the raised height $H_1$ is in a range from about 12 nm to about 21 nm. If raised height $H_1$ is too large, the first gate spacers 122 may collapse due to compressive stress induced from the first epitaxial structure 126. If raised height $H_1$ is too small, a contact landing window will be impacted to induce open circuits and yield loss.

Figure 1G:
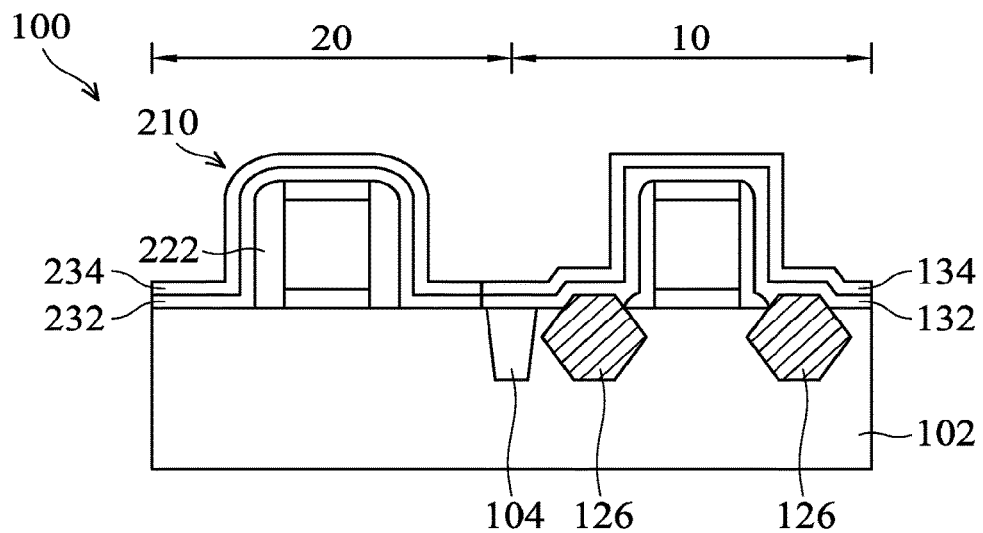

Afterwards, the first photoresist layer 205 in the second conductive type device region 20is removed. After the first photoresist layer 205 is removed, a third protective layer 132 and a fourth protective layer 134 are conformally formed on the first epitaxial structure 126 and the first gate stack structure 110 as shown in FIG. 1G, in accordance with some embodiments of the disclosure.

The third protective layer 132 and the fourth protective layer 134 are used to protect the underlying layers from being damaged during a subsequent epi process. The third protective layer 132 and the fourth protective layer 134 are made of different materials.

In some embodiments, the third protective layer 132 is made of silicon oxide ($SiO_2$), the fourth protective layer 134 is made of silicon nitride ($Si_3N_4$). The third protective layer 132 and the fourth protective layer 134 are respectively formed by low-pressure chemical vapor deposition (LPCVD), plasma-enhanced chemical vapor deposition (PECVD), atomic layer deposition (ALD), another applicable process, or combinations thereof.

Figure 1H:
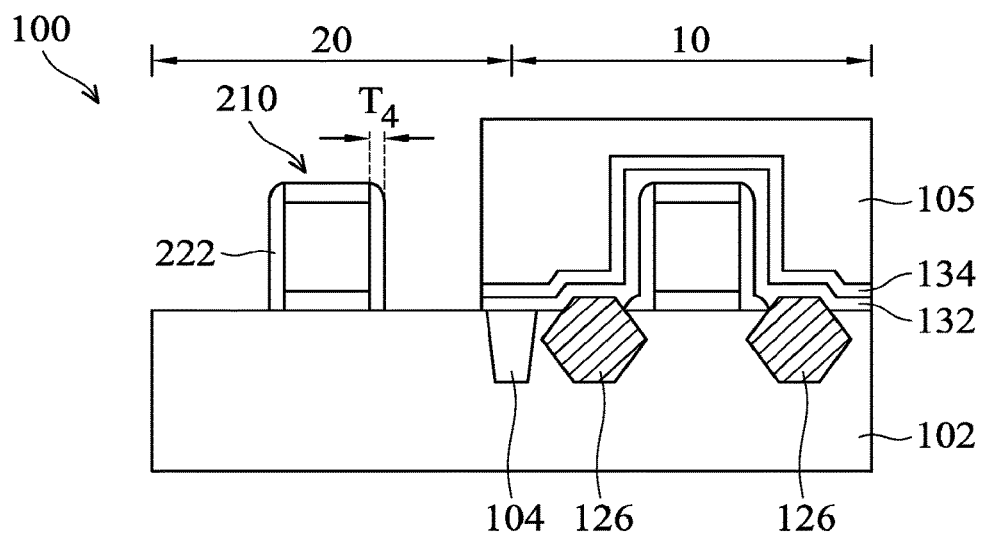

After the third protective layer 132 and the fourth protective layer 134 are formed, a second photoresist layer 105 is formed in the first conductive type device region 10 as shown in FIG. 1H, in accordance with some embodiments of the disclosure.

Afterwards, the first protective layer 232, the second protective layer 234 and the second gate spacers 222 are removed. As a result, the thickness of the second gate spacers 222 is reduced from thickness $T_1$ to thickness $T_4$. In some embodiments, the thickness $T_4$ of the second gate spacers 222 in the second conductive type device region 20 is the same as thickness $T_2$ of the first gate spacers 122 in the first conductive type device region 10.

Figure 1I:
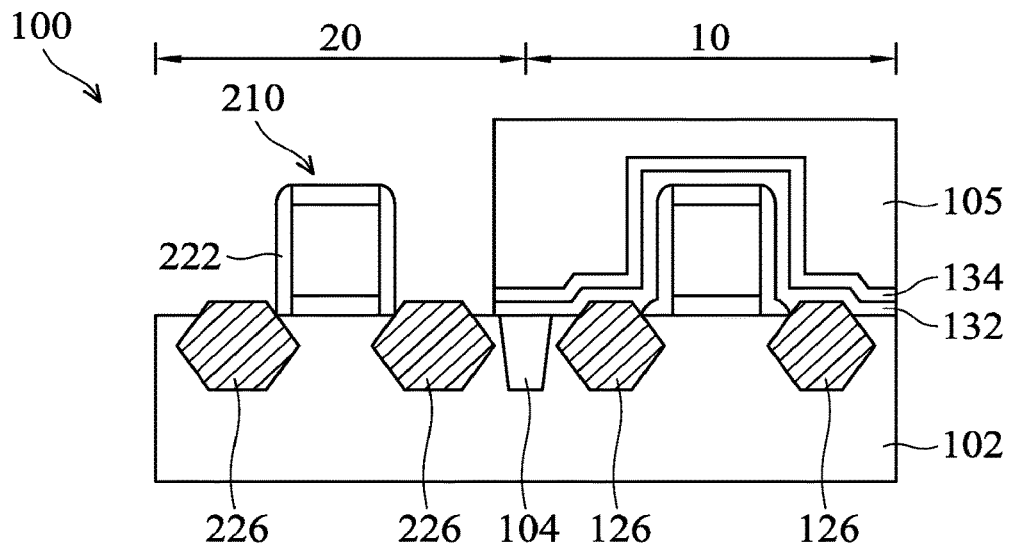

Afterwards, a portion of the substrate 102 in the second conductive type device region 20 is etched to form a recess (not shown) and a second epitaxial structure 226 is formed in the recess as shown in FIG. 1I, in accordance with some embodiments of the disclosure.

In some embodiments, the second epitaxial structure 226 is silicon phosphor (SiP). The second epitaxial structure 226 is formed by an epi process. The epi process may include a selective epitaxial growth (SEG) process, a chemical vapor deposition (CVD) process (e.g., vapor-phase epitaxy (VPE), a low pressure chemical vapor deposition (LPCVD) and/or ultra-high vacuum CVD (UHV-CVD)), molecular beam epitaxy, another applicable epi process, or combinations thereof.

The formation process of the second epitaxial structure 226 may use gaseous and/or liquid precursors. It should be noted that, in some embodiments, some corrosive gas, such as HCl, is used during the formation of the second epitaxial structure 226. However, the corrosive gas may etch some structures which were formed before.

Figure 1J:
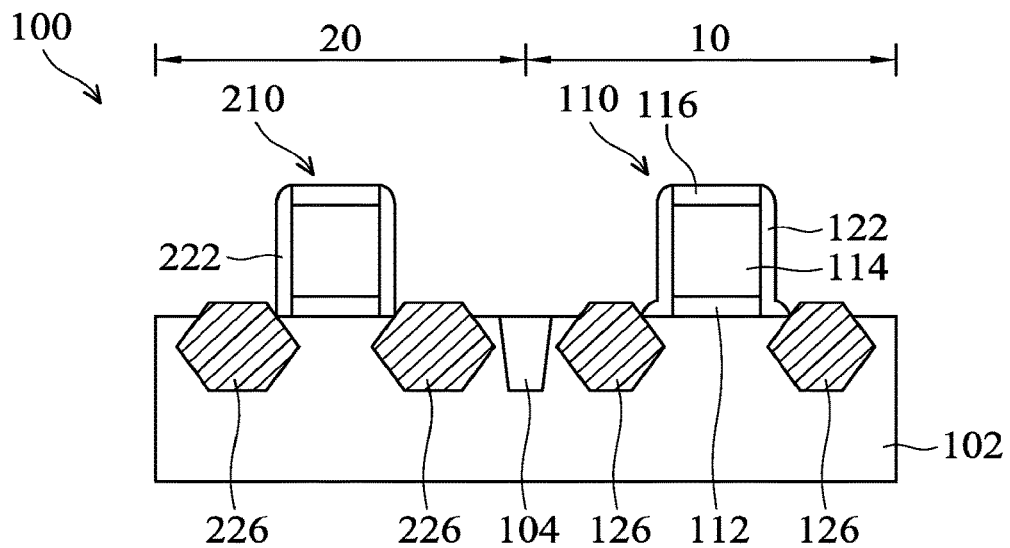

After the second epitaxial structure 226 is formed in the second conductive type device region 20, the second photoresist layer 105, the third protective layer 132 and the fourth protective layer 134 are respectively removed as shown in FIG. 1J, in accordance with some embodiments of the disclosure.

The third protective layer 132 is removed by an etching process using an etching gas including $CH_2F_2$, $CHF_3$, $CF_4$, another applicable gas, or combinations thereof. The fourth protective layer 134 is removed by another etching process using an etching gas including $Cl_2$, HBr, $CH_2F_2$, $CHF_3$, $CF_4$, another applicable gas, or combinations thereof.

As shown in FIG. 1J, the first gate stack structure 110 is formed in the first conductive type device region 10, and the second gate stack structure 210 is formed in the second conductive type device region 20. The first gate spacers 122 are formed on opposite sidewalls of the first gate stack structure 110, and the second gate spacers 222 are formed on opposite sidewalls of the second gate stack structure 210. It should be noted that the first gate spacers 122 has the top portion 122a and the protruding bottom portion 122b. The bottom portion 122b slopes to the top surface 102a of the substrate 102. The protruding bottom portion 122b is gradually increased towards the substrate 102. The bottom portion 122b has the bottom surface 123 which is in direct contact with the substrate 102 and the bottom surface 123 has a maximum thickness $T_3$ (referring to FIG. 2).

It should be noted that, as mentioned above, some corrosive gas, such as HCl, is used during the formation of the second epitaxial structure 226. However, the corrosive gas may etch some structures. If no protruding bottom portion is pre-formed on the sidewall of the first gate stack structure, a thin first protective layer and a thin second protection are formed at a location between the first epitaxial structure and the first gate stack structure. The thin first protective layer and the thin second protection are not thick enough to inhibit the attack of the corrosive gas (such as HCl). As a result, some first epitaxial structure may be etched by the corrosive gas, and the performance of the first gate stack structure is degraded.

In order to ensure the performance of the first gate stack structure, the protruding bottom portion 122b of the first gate spacers 122 is provided to protect the first epitaxial structure 126 from being etched by the corrosive gas which is used in subsequent epi process for forming the second epitaxial structure 226.

Embodiments for forming a semiconductor device structure are provided. A semiconductor device structure includes a first gate stack structure and a second gate stack structure are formed on a substrate. The first gate spacers are formed on the sidewalls of the first gate stack structure. The first gate spacers include a top portion and a protruding bottom portion. The protruding bottom portion is extended along a top surface of the substrate. A first epitaxial structure is first formed adjacent to the protruding bottom portion, and then a second epitaxial structure is formed adjacent to the second gate spacers. Due to the protection of the protruding bottom portion, the first epitaxial structure is free from being etched by the corrosive gas which is used when forming the second epitaxial structure. Therefore, the performance of the semiconductor device structure is further improved.

In some embodiments, a semiconductor device structure is provided. The semiconductor device structure includes a substrate and a gate stack structure formed on the substrate. The semiconductor device structure also includes gate spacers formed on the sidewall of the gate stack structure, and the gate spacers include a top portion and a bottom portion adjoined to the top portion, and the bottom portion slopes to a top surface of the substrate. The semiconductor device structure further includes an epitaxial structure formed adjacent to the gate spacers, and the epitaxial structure is formed below the gate spacers.

In some embodiments, a semiconductor device structure is provided. The semiconductor device structure includes a substrate and a first gate stack structure and a second gate stack structure formed on the substrate. The semiconductor device structure also includes first gate spacers formed on the sidewalls of the first gate stack structure, and the first gate spacers comprise a top portion and a protruding bottom portion. The semiconductor device structure further includes second gate spacers formed on the sidewalls of the second gate stack structure. The semiconductor device structure further includes a first epitaxial structure formed adjacent to the first gate stack structure, and the protruding bottom portion is in direct contact with the first epitaxial structure. The semiconductor device structure includes a second epitaxial structure formed adjacent to the second gate stack structure.

In some embodiments, a method for forming a semiconductor device structure is provided. The method includes providing a substrate and forming a gate stack structure on the substrate. The method also includes forming gate spacers on the sidewalls of the gate stack structure, the gate spacers comprise a top portion and a bottom portion adjoined to the top portion, and the bottom portion slopes to a top surface of the substrate. The method further includes forming an epitaxial structure adjacent to the gate stack structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, the method comprising:
    forming a first gate stack structure and a second gate stack structure over a substrate;
    depositing a dielectric layer over the first gate stack structure and the second gate stack structure;
    forming gate spacers on sidewalls of the first gate stack structure and sidewalls of the second gate stack structure, wherein the forming the gate spacers includes:
        performing a first etching process on the dielectric layer over the first gate stack structure and the second gate stack structure to form first spacer elements abutting each of the first gate stack structure and the second gate stack structure;
        depositing a photoresist layer over the first gate stack structure; and
        while the photoresist layer is disposed over the first gate stack structure, performing a second etching process on the dielectric layer, wherein the second etching process etches the first spacer elements abutting the second gate stack structure to form second spacer elements comprising a top portion having a first outer surface and a bottom portion having a second outer surface, wherein the bottom portion is adjoined to the top portion and the first and second outer surfaces meet defining a recessed corner, and wherein the bottom portion slopes to a top surface of the substrate; and
    forming a first epitaxial structure adjacent to the second gate stack structure; and
    forming a second epitaxial structure adjacent the first gate stack structure.

2. The method for forming the semiconductor device structure as claimed in claim 1, wherein the first etching process is a dry etching process and the second etching process is a wet etching process.

3. The method for forming the semiconductor device structure as claimed in claim 2, wherein the wet etching process comprises using a hydrofluoric acid (HF) solution as an etching reagent.

4. The method for forming the semiconductor device structure as claimed in claim 2, wherein the dry etching process is operated by power in a range from about 70 W to about 130 W.

5. The method for forming the semiconductor device structure as claimed in claim 1, wherein the recessed corner has an angle between approximately 90 and 178 degrees between the first outer surface and the second outer surface.

6. The method for forming the semiconductor device structure as claimed in claim 5, wherein the recessed corner is lower than a top of a gate dielectric of the second gate stack structure.

7. The method for forming the semiconductor device structure as claimed in claim 1, wherein the forming the first epitaxial structure includes growing a semiconductor material such that an interface is formed between the semiconductor material and the bottom portion of the second spacer elements.

8. A method of fabricating a semiconductor device, the method comprising:
    providing a substrate having a first gate structure and a second gate structure disposed thereon;
    forming a conformal dielectric layer over the first gate structure and the second gate structure;
    performing a first etching process on the conformal dielectric layer to form first spacer elements having a first thickness abutting each of the first gate structure and the second gate structure;
    after the first etching process and while a masking element overlies the first gate structure, performing a second etching process on the first spacer elements having the first thickness abutting the second gate structure, wherein the second etching process reduces the first thickness of an upper portion of each of the first spacer elements to a second thickness thereby forming modified spacer elements each having a profile with the upper portion having the second thickness and a bottom portion below the upper portion and extending away from the second gate structure, wherein the bottom portion is contiguous with the upper portion and includes a continuously increasing thickness from the second thickness to point level with a bottom of a gate dielectric layer over the second gate structure; and
    using the modified spacer elements as masking elements while etching a recess in the substrate.

9. The method of claim 8, further comprising:
    growing an epitaxial structure in the recess, wherein the epitaxial structure touches the modified spacer elements.

10. The method of claim 8, wherein the first etching process includes a dry etching process and the second etching process includes a wet etching process.

11. The method of claim 8, further comprising:
    removing the masking element from the first gate structure to expose the first spacer elements; and
    reducing the thickness of the first spacer elements abutting the first gate structure.

12. The method of claim 8, wherein the masking element includes a patterned photoresist layer.

13. The method of claim 12, further comprising:
    prior to forming the patterned photoresist layer, depositing at least one protective layer over the first gate structure and the first spacer elements abutting the first gate structure.

14. The method of claim 13, wherein the at least one protective layer includes a silicon oxide layer or a silicon nitride layer.

15. A method of fabricating a semiconductor device, the method comprising:
    providing a substrate having a first gate structure and a second gate structure disposed thereon;
    forming a dielectric layer over the substrate including over the first gate structure and the second gate structure;
    etching the dielectric layer to form spacer elements abutting sidewalls of each of the first gate structure and the second gate structure;
    forming a first protection layer over the first gate structure having the spacer elements; and
    while the first protection layer is disposed over the first gate structure, performing another etching process on the spacer elements of the second gate structure to form a modified profile of the spacer elements of the second gate structure, wherein the modified profile includes a protruding bottom portion; and after performing the another etching process, forming a second protection layer over the second gate structure and removing the first protection layer over the first gate structure.

16. The method of claim 15, further comprising: using the spacer elements having the modified profile as a masking element while etching a recess in the substrate adjacent the second gate structure while the first protection layer is disposed over the first gate structure.

17. The method of claim 15, further comprising:
after forming the second protection layer over the second gate structure and removing the first protection layer over the first gate structure, reducing a thickness of the spacer elements abutting the first gate structure to form a reduced thickness spacer element.

18. The method of claim 17, further comprising: using the reduced thickness spacer element as a masking element while etching another recess in the substrate adjacent the first gate structure while the second protection layer is over the second gate structure.

19. The method of claim 15, wherein the first protection layer is multiple layers.

20. The method of claim 19, wherein the second protection layer is multiple layers.

* * * * *